(12) United States Patent
Liu et al.

(10) Patent No.: US 7,503,746 B2
(45) Date of Patent: Mar. 17, 2009

(54) FAN OF HEAT SINK

(75) Inventors: Hung-Sheng Liu, Hsin-Chuang (TW); Ya-Yu Cao, Kaohsiung (TW)

(73) Assignee: Asia Vital Components Co., Ltd., Hsin-Chuang (TW)

( * ) Notice: Subject to any disclaimer, the term of this patent is extended or adjusted under 35 U.S.C. 154(b) by 257 days.

(21) Appl. No.: 11/414,461

(22) Filed: May 1, 2006

(65) Prior Publication Data
US 2007/0253813 A1 Nov. 1, 2007

(51) Int. Cl.
*F01D 1/02* (2006.01)
*F04D 29/38* (2006.01)

(52) U.S. Cl. ............... 415/204; 415/206; 416/187; 416/189; 416/210 R (58) Field of Classification Search ............... 415/204, 415/208.2, 56.3, 159, 185, 190; 416/187, 416/189, 210 R, 228, 243
See application file for complete search history.

(56) References Cited

U.S. PATENT DOCUMENTS

| | | | | |
|---|---|---|---|---|
| 3,081,019 | A * | 3/1963 | Freevol | 415/198.1 |
| 5,813,831 | A * | 9/1998 | Matsunaga et al. | 415/173.6 |
| 6,132,170 | A * | 10/2000 | Horng | 415/178 |
| 6,142,864 | A * | 11/2000 | Uemura et al. | 454/121 |
| 6,299,409 | B1 * | 10/2001 | Matsunaga et al. | 415/206 |
| 6,457,955 | B1 * | 10/2002 | Cheng | 417/423.8 |
| 6,802,699 | B2 * | 10/2004 | Mikami et al. | 417/369 |
| 6,893,218 | B2 * | 5/2005 | Ito | 415/198.1 |
| 6,964,555 | B2 * | 11/2005 | Ochiai et al. | 415/204 |
| 7,008,189 | B2 * | 3/2006 | Jarrah et al. | 416/175 |
| 7,179,050 | B2 * | 2/2007 | Hopfensperger | 415/204 |
| 7,207,779 | B2 * | 4/2007 | Horng et al. | 416/186 R |
| 7,220,101 | B2 * | 5/2007 | Chen et al. | 415/204 |
| 2002/0090307 | A1 * | 7/2002 | Cheng | 417/423.1 |
| 2002/0146318 | A1 * | 10/2002 | Horng | 415/204 |
| 2003/0063973 | A1 * | 4/2003 | Horng et al. | 415/204 |
| 2007/0253813 | A1 * | 11/2007 | Liu et al. | 415/206 |
| 2008/0006043 | A1 * | 1/2008 | Lee et al. | 62/186 |

* cited by examiner

*Primary Examiner*—Edward Look
*Assistant Examiner*—Sean J Younger (57) ABSTRACT

A fan of a heat sink comprising a hub, a plurality of ribs and a set of blades is provided. A distal end of the ribs is connected to circular sidewall of the hub and the set of blades are connected to the primal end of the ribs. The set of blades comprises an outer ring, multiple first blades, a guiding ring connected to the inner side of the first blades and multiple second blades positioned at the inner side of the first blades extending upwards from the top side of the guiding ring. The primal end of the ribs is connected to the guiding ring having an inclined slope extending from the hub towards the outer ring. The first and the second blades are adopted for increasing the air flow area, and thereby increase the air volume and air pressure and the inclined slope of the guiding ring is adopted to smoothly change the flow direction of the sucked air and thereby reduce the resistance to the air flow.

4 Claims, 7 Drawing Sheets

FAN OF HEAT SINK

BACKGROUND OF THE INVENTION

1. Field of Invention

The present invention relates to a fan, and more particularly to a fan of a heat sink.

2. Description of the Related Art

The rapid development of electronic technology has improved the operation speed of the semiconductor devices, such as central processing unit (CPU) or chip. However, operation of the high speed operating semiconductor device generates large amount of heat, which may significantly increase the temperature and may cause abnormal operation of the semiconductor device and also reduce the service life of the semiconductor device if the heat is not timely dissipated.

Accordingly, it is important to dissipate the heat generated by the operation of the semiconductor device for proper operation thereof. Generally, there are two types of heat sinks, namely air cooler and water cooler. The air cooler including a fan is generally employed in electronic devices for dissipating the heat generated during the operation thereof.

The fan is adopted for increasing air circulation to quickly dissipate the heat generated by the operation of semiconductor devices, mostly applied in a personal computer. Manufacturers developed a heat sink with axial air inlet and lateral air outlet suitable for all kinds of environmental conditions of the heating elements of the semiconductor devices.

Figure 1:
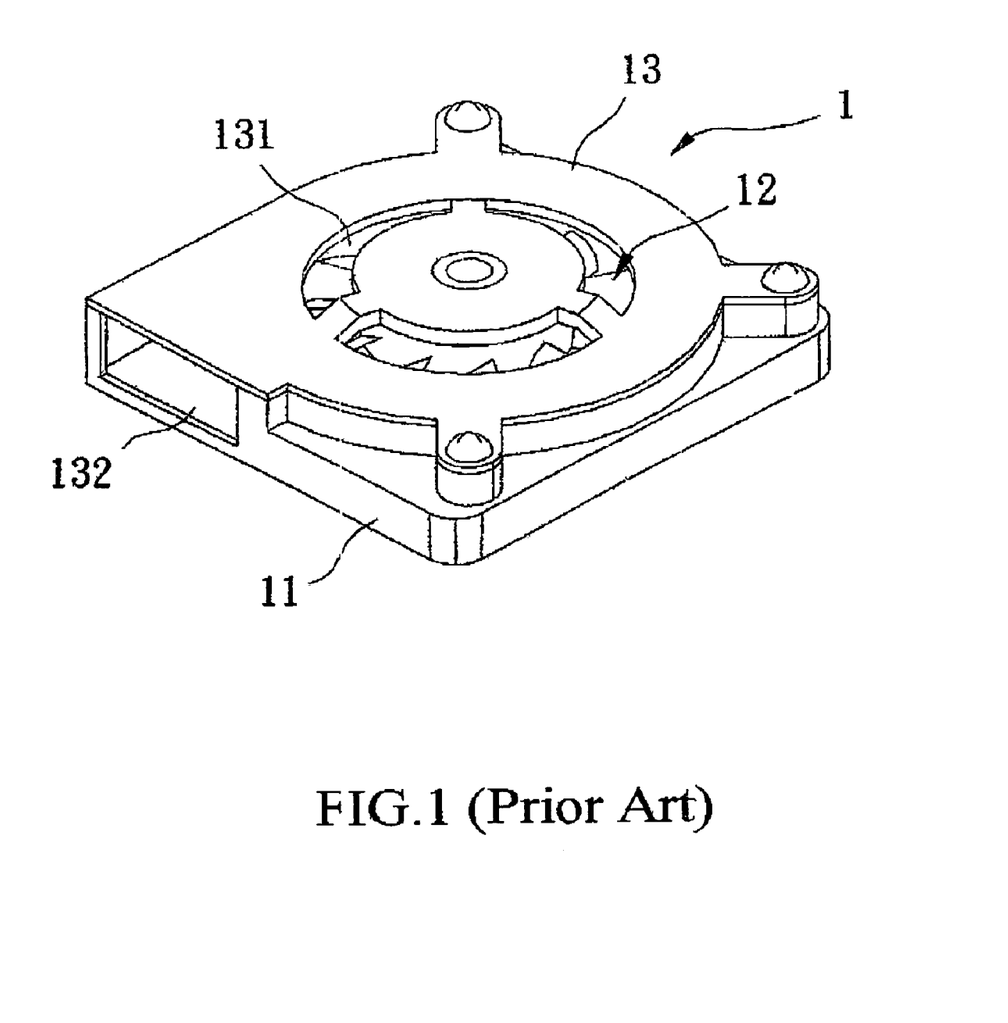
FIG. 1 is a perspective view of a conventional axial heat sink.

FIG. 1 shows a DC brushless axial heat sink having axial air inlet and lateral air outlet. The axial heat sink 1 comprises a frame 11, a fan 12 disposed in the frame 11 and a housing 13 covering the fan 12 and the frame 11. The housing 13 comprises an air inlet 131 formed on an upper part of the fan 12 and an air outlet 132 formed on a side of the frame 11.

Figure 2:
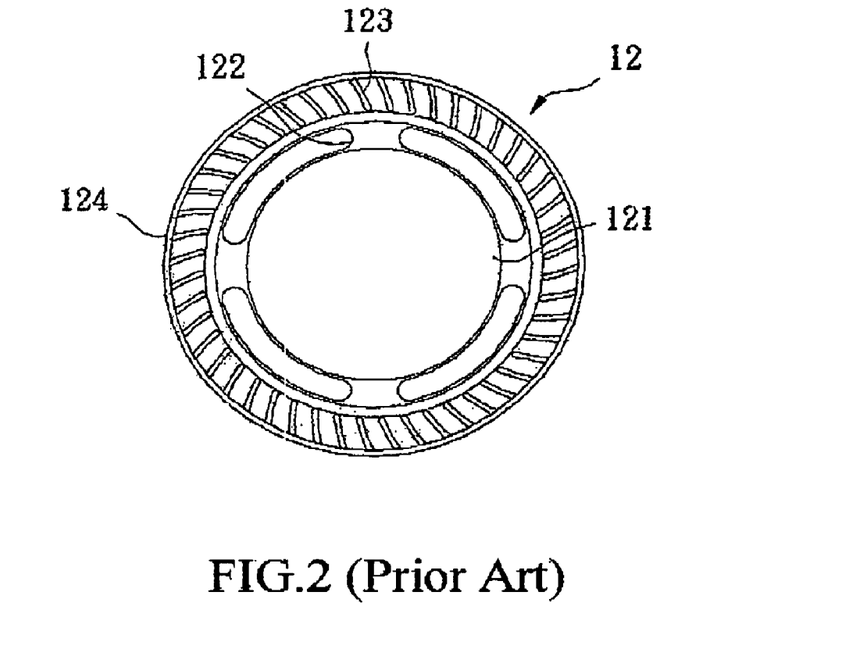
FIG. 2 is a top view of the conventional axial heat sink.
Figure 3:
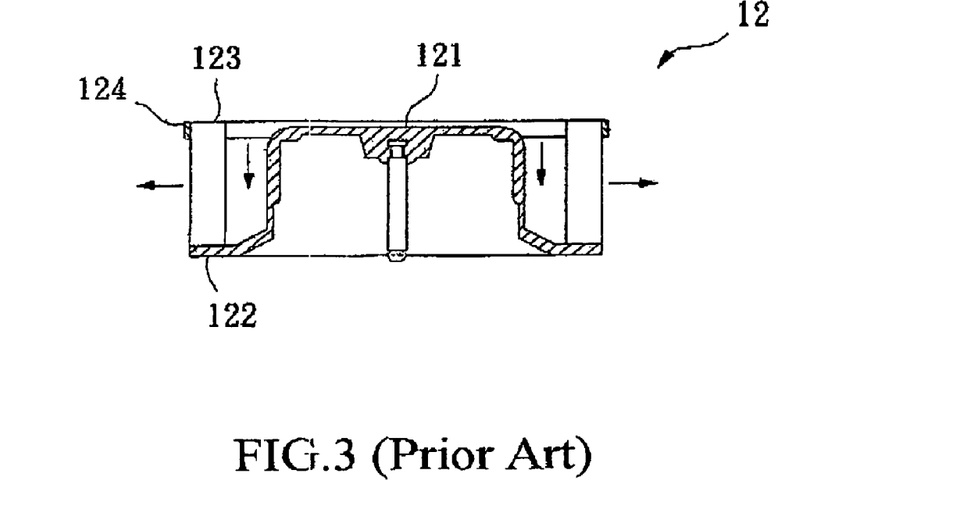
FIG. 3 is a cross sectional side view of the fan shown in FIG. 2.

Referring FIGS. 2 and 3, the fan 12 comprises a hub 121, a plurality of ribs 122 connected to the hub 121, a plurality of blades 123 connected to the plurality of ribs 122 and a ring 124 connected to the blades 123. When the fan 12 rotates due to the operation of the axial heat sink 1, air enters into the top air inlet 131 via the housing 13 as shown in FIG. 3, and the air is then sucked from the top of the hub 121 and exits out via the air outlet of the housing 13 to dissipate the heat.

However, the air sucked via the top air inlet 131 of the housing 13 during the operation of the axial heat sink 1 directly blows and vertically impinges onto the surface of the frame 11 to change the air flow direction, and then exits out via the air outlet 132. Following are some of the defects of the conventional DC brushless heat sink 1 described above.

1. Poor heat dissipation effect: When the axial heat sink 1 operates, the air directly impinges onto the surface of the frame 11, and the air flow direction is drastically changed from axial to lateral direction causing decrease in volume of the incoming air. Thus, not only the passage of air flow is resisted but also the pressure and volume of air exiting out of the heat sink are reduced, and therefore the heat dissipation effect is reduced.

2. Poor air circulation: The ring 124 of the fan 12 is positioned at the outer flange of the blades 123, and therefore when the air vertically impinges on the surface of the frame 11 and then changes the direction to exit out through the gaps of the blades 123, the ring 124 blocks or resists the air from exiting out of the heat sink and thereby reduce the heat dissipation effect.

Therefore, how to overcome the above defects for increasing the volume of air exiting out of the axial heat sink in order to improve the heat dissipation effect is the main object of the present invention.

SUMMARY OF THE INVENTION

Accordingly, in the view of the foregoing, the present invention provides a fan of a heat sink capable of increasing the volume of the air flow to promote the heat dissipation effect thereof.

The fan of the heat sink of the present invention comprises a housing having a space, an air inlet communicating with the space formed on a top side and an air outlet communicating with the space formed on one side thereof. The fan is disposed in the housing and comprises a hub, a plurality of ribs and a set of blades.

The hub comprises a ring disposed facing the air inlet. The ribs are alternately positioned round the hub, and the distal end of the ribs is alternately connected to the ring. The blades are connected to the proximal end of the ribs and have an outer ring surrounding the ring of the hub. A plurality of first blades is alternately disposed extending upwards from the top side of the outer ring, a guiding ring is connected to the inner side of the first blades and a plurality of second blades is disposed on the inner side of the first blades extending upwards from the top side of the guiding ring. The proximal end of the ribs is connected to the guiding ring having an inclined slope extending from the hub towards the outer ring.

According to an embodiment of the present invention, the first blades and the second blades are adopted for increasing the air flow area in order to increase the air circulation, and the slope of the guiding ring is adopted for smoothly guiding the air between the first and second blades in order to reduce the air disturbance or resistance and thereby promote the heat dissipation effect.

BRIEF DESCRIPTION OF THE DRAWINGS

For a more complete understanding of the present invention, reference will now be made to the following detailed description of preferred embodiments taken in conjunction with the following accompanying drawings.

DETAILED DESCRIPTION OF THE PREFERRED EMBODIMENTS

Figure 4:
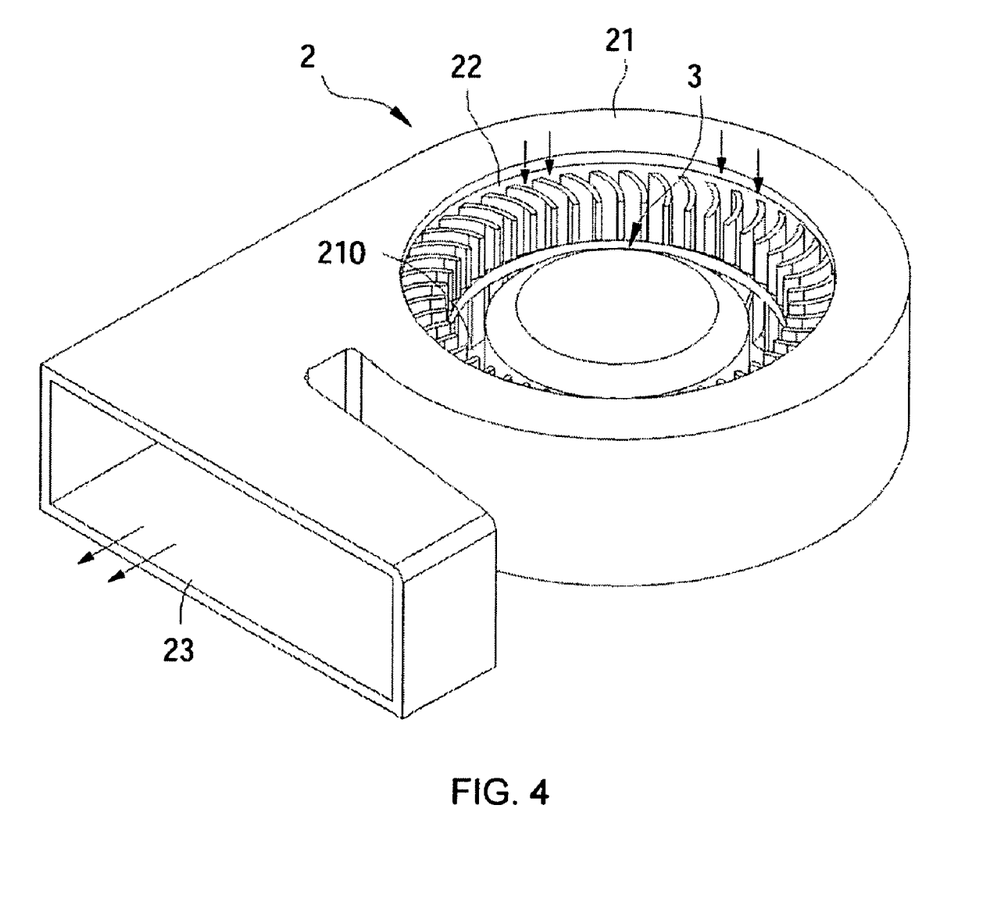
FIG. 4 is a perspective view of a fan of a heat sink according to a preferred embodiment of the present invention.
Figure 5:
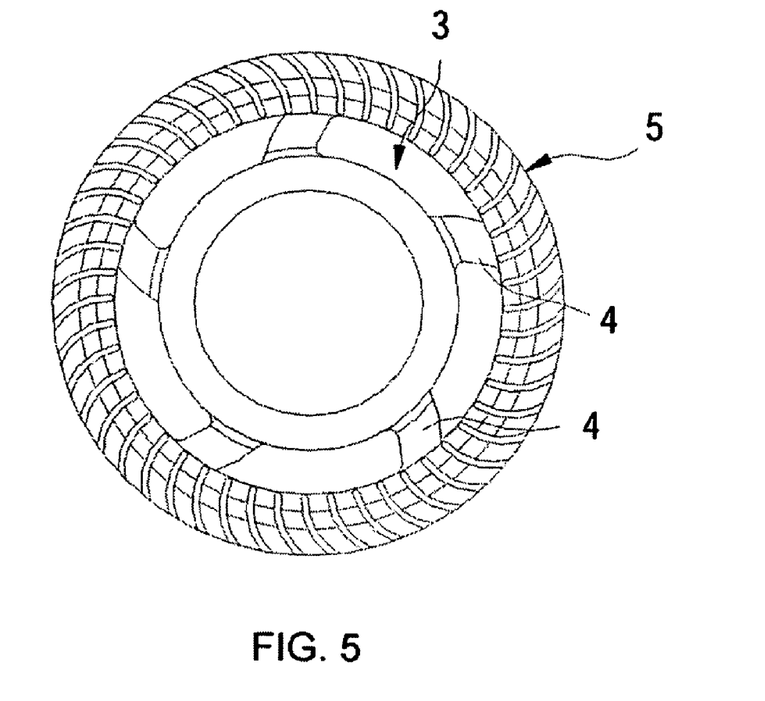
FIG. 5 is a top view of the fan according to the preferred embodiment of the present invention.

Referring to FIGS. 4 and 5, the fan according to the preferred embodiment of the present invention is disposed in a housing 2. The housing 2 comprises a circular sidewall 21 enclosing a space 210, an air inlet 22 formed on a top side of the round sidewall 21, wherein the air inlet 22 communicates with the space 210, and an air outlet 23 formed on a side of the housing 2, wherein the air outlet 23 communicates with the space 210. The fan 5 of the heat sink comprises a hub 3, a plurality of ribs 4 and a set of blades.

Figure 6:
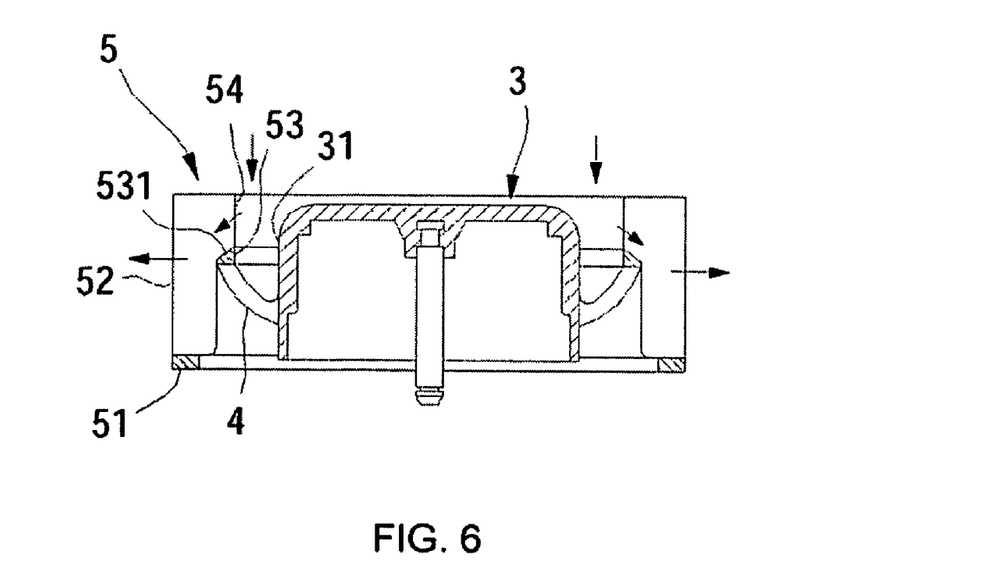
FIG. 6 is a cross sectional side view of the fan shown in FIG. 5.
Figure 7:
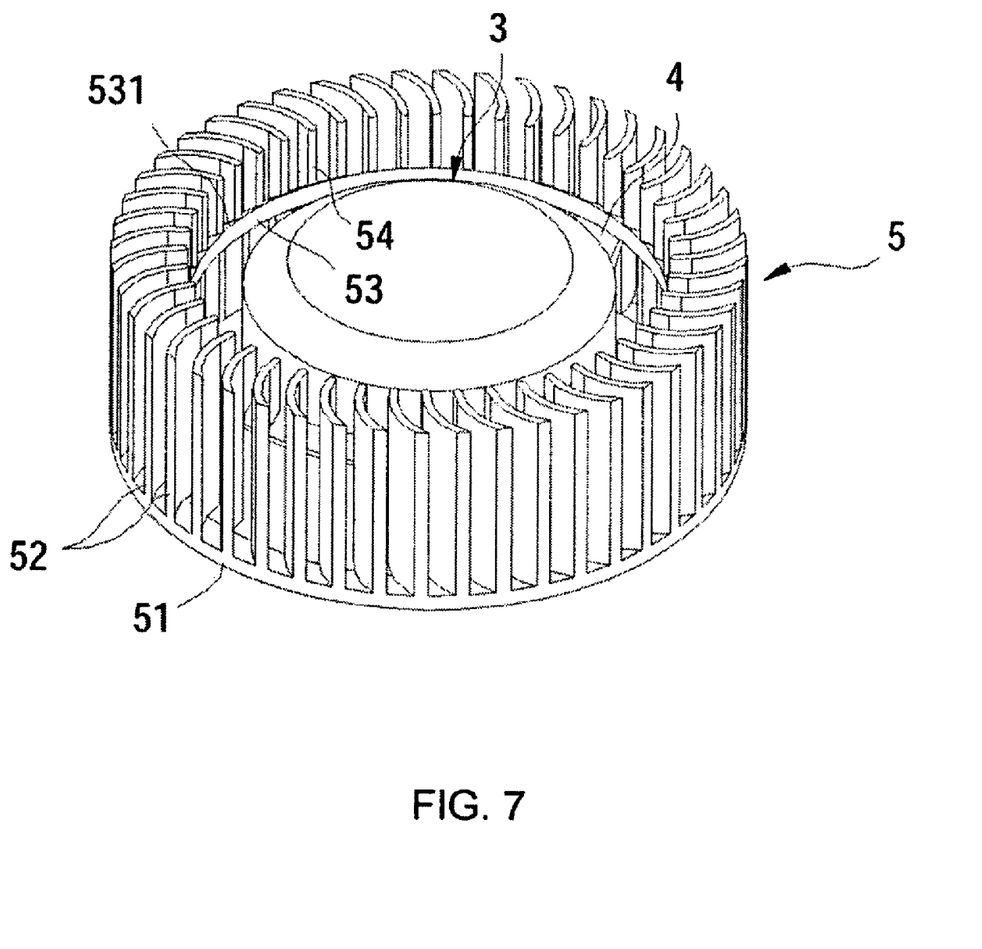
FIG. 7 is a perspective of the fan shown in FIG. 5.

Referring to FIGS. 6 and 7, the hub 3 comprises a circular sidewall 31. The ribs 4 are disposed around the periphery of the hub 3 and the distal end of the ribs 4 is connected to the circular sidewall 31. In this embodiment, the top surface and the side of the ribs 4 have an arch-shape.

The fan 5 is connected to the proximal end of the ribs 4, and has an outer ring surrounding the bottom flange of the circular sidewall 31 of the hub 3. A plurality of first blades 52 alternately extend upwards from a top surface of the outer ring 51, a guiding ring 53 are connected to the inner side of the first blades 52, and a plurality of second blades 54 are positioned on an inner side of the first blades 52 and extend upwards from the top side of the guiding ring 53. The sectional sides of the first blades 52 and the second blades 54 comprise an arch-shape respectively. In other words, the curves of the second blades 54 constitute the integral extended portions of the first blades 52, and the top surface of the guiding ring 53 comprises an inclined slope 531 extending from the hub 3 towards the outer ring 51. The slope 531 is adopted for guiding the direction of the air flow and this mechanism will be described in detail hereinafter.

In this embodiment, the guiding ring 53 is connected to the inner flange of the first blades 52 at a position, from the top to the bottom, roughly about one third of the height of the inner flange. The second blades 54 extend upwards from the slope 531 of the guiding ring 53 up to the height of the first blades 52.

The lateral length and the horizontal curve length of each second blade 54 are one third of that of the corresponding first blade 52. Particularly, the lateral length and the curve length of each second blade 54 depend on the height of the connection between the guiding ring 53 and the corresponding first blades 52 and the weight of the sectional side of the slope 531. It should be noted that any variation of the structure described above would also be construed to be within the scope of the present invention.

When the hub 3 rotates, the ribs 4 and the fan 5 also rotate along with the hub 3 to suck the air from outside into the space 210 axially via the air inlet 22 of the housing 2, the direction air flow is shown in FIGS. 4 and 6. The guiding ring 53 of the fan 5 guides the air to laterally exit to outside via the side air outlet 23 along an inclined angle corresponding to that of the slop 531. Thus, the rebounding air flow pressure occurring due to direct blowing on the bottom of the housing 2 may be reduced and thereby maximum volume of air may exit out of the heat sink. Furthermore, the arch shaped top surfaces and sides of the ribs 4 may effectively reduce the air resistance while sucking the air axially and render the air flow smooth.

In addition, the structure of the of first and second blades 52 and 54 of the fan 5 may increase the air flow area within the space 210 to drastically increase the air flow within the space 210 and substantially increase the pressure and the volume of the air exiting to outside.

Figure 8:
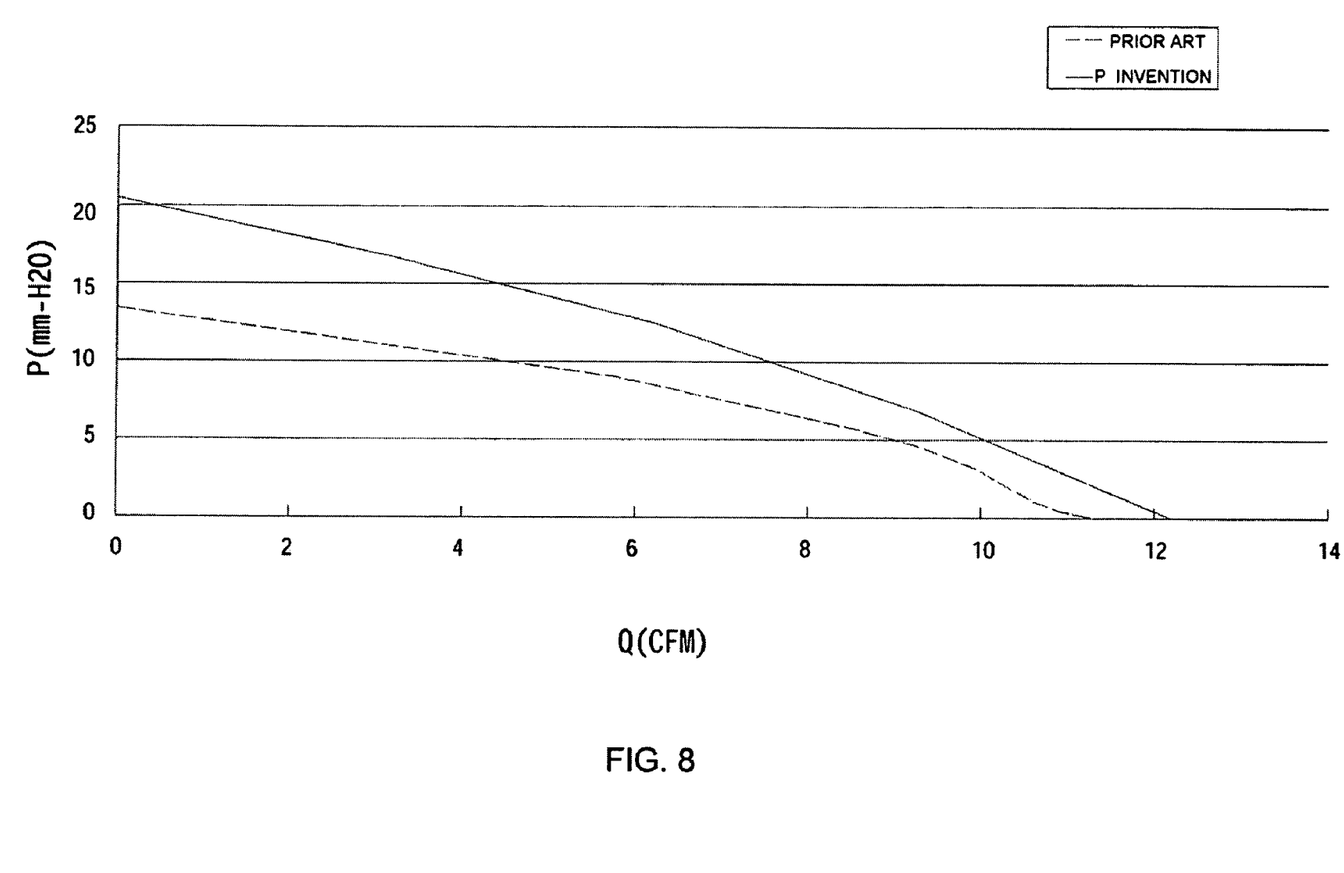
FIG. 8 is an air pressure curve showing the performance of the fan according to the preferred embodiment of the present invention and the conventional DC brushless axial heat sink.

FIG. 8 is a curve showing performance of the fan of the heat sink according to the embodiment of the present invention and the conventional fan 12 of the axial heat sink 1, wherein the X co-ordinate represents the air flow rate (Q (CFM)) and Y co-ordinate represents the air pressure (P(mm-H2O)) respectively. In other words, the curve illustrates the test result of the air pressure within a unit space, where the size of fan and the housing of the present invention were identical to those used in conventional heat sink, and the test result showed that fan of the present invention produced comparatively higher air pressure and larger air volume compared to that of the conventional fan. In other words, an increase in the air flow area promotes smooth passage of air flow and smooth change of air flow direction, and also increases the air pressure and the air volume.

Figure 9:
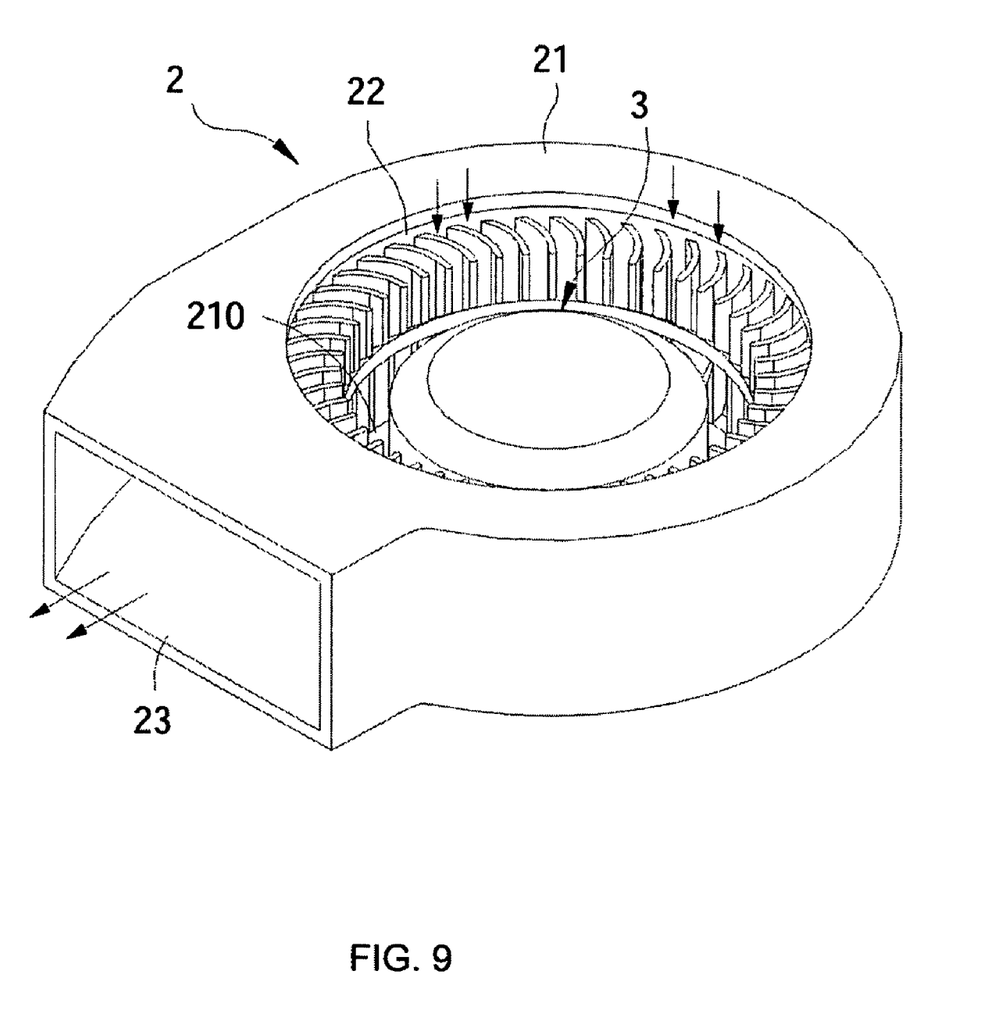
FIG. 9 is a perspective view of a fan of the heat sink enclosed in a different type of housing according to another preferred embodiment of the present invention.

FIG. 9 shows a perspective view of a fan of a heat sink installed in a different type of housing according to another embodiment of the present invention, where the same advantageous effects of increased air volume and higher air pressure are achieved in order to promote the heat dissipation effect.

As described above with reference to FIGS. 6 and 7, the fan of the present invention employs the first and second blades 52 and 54 to increase the overall surface area of the blades, which in turn increases the air flow area within the space 210 to substantially increase the air volume. In addition, the outer ring 51 is positioned on the bottom of the first blades 52, and therefore the air flow direction is unaffected unlike the case of the conventional design that resists or interferes with the air flow direction.

In summary, the fan of the present invention increases the air flow area within the space 210 to effectively increase the volume and pressure of the air. Furthermore, the slope 531 of the guiding ring 53 is adopted for smoothly guiding the change of air flow direction of the axially sucked air to exit out along the lateral or horizontal direction via the air outlet 23 instead of directly blocking or resisting the air flow to forcefully change the air flow direction which may tend to reduce the volume and the pressure of the air. Thus, the air flow may be substantially rendered smooth and more stable, and thereby promote the heat dissipation effect.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations in which fall within the spirit and scope of the included claims. All matters set forth herein or shown in the accompanying drawings are to be interpreted in an illustrative and non-limiting sense.

What is claimed is:

1. A fan of a heat sink, said heat sink comprising a housing enclosing a space, said housing having an air inlet communicating with said space formed on a top surface thereof and an air outlet communicating with said space formed on a side thereof, said fan being installed in said housing, the fan comprising:
   a hub, comprising a circular sidewall facing said air inlet;
   a plurality of ribs, alternately disposed around said hub, wherein a distal end of said ribs are connected to said circular sidewall; and
   a set of blades, connected to a proximal end of said ribs, comprising an outer ring surrounding said circular sidewall of said hub, a plurality of alternately arranged first blades extending upwards from a top surface of said outer ring, a guiding ring connected to an inner side of said first blades and a plurality of second blades positioned at said inner side of said first blades and extending upwards from said top side of said guiding ring, wherein said proximal end of said ribs are connected to said guiding ring having an inclined slope extending from the hub towards the outer ring, wherein when said fan rotates, an air flow is guided from said air inlet to a space between said first and second blades, an air flow area is increased to increase a pressure and volume of air exiting to outside, and wherein said slope of said guiding ring is adopted for smoothly flowing air between said first and second blades and finally exiting said air to outside via said air outlet.

2. The fan of a heat sink according to claim 1, wherein said first and second blades have an arch-shape.

3. The fan of a heat sink according to claim 2, wherein a lateral length and a horizontal curve length of each second blade are one third of that of a corresponding first blade.

4. The fan of a heat sink according to claim 1, wherein each rib has an arch-shape on a top surface and a side thereof.

* * * * *